United States Patent [19]
Rao

[11] Patent Number: 5,856,940
[45] Date of Patent: Jan. 5, 1999

[54] LOW LATENCY DRAM CELL AND METHOD THEREFOR

[75] Inventor: G. R. Mohan Rao, Plano, Tex.

[73] Assignee: Silicon Aquarius, Inc., Richardson, Tex.

[21] Appl. No.: 911,737

[22] Filed: Aug. 15, 1997

[51] Int. Cl.[6] .................................................. G11C 11/24
[52] U.S. Cl. .......................................... 365/149; 365/203
[58] Field of Search .............................. 365/149, 189.12, 365/208, 222, 150, 203

[56] References Cited

U.S. PATENT DOCUMENTS

| | | | |
|---|---|---|---|
| 4,800,530 | 1/1989 | Itoh et al. | 365/189.12 |
| 5,007,022 | 4/1991 | Leigh | 365/189 |
| 5,010,519 | 4/1991 | Yoshimoto et al. | 365/149 |
| 5,323,350 | 6/1994 | McLaury | 365/208 |
| 5,442,588 | 8/1995 | Runas | 365/222 |

OTHER PUBLICATIONS

"Transparent–Refresh DRAM (TreD) Using Dual–Port DRAM Cell" by Sakurai, Nogami, Sawada and Iizuka, 1988 IEEE Custom Integrated Circuits Conference pp. 4.3.1 through4.3.4.

Lionel S. White et al., "Session XVII: Random Access Memories", IEEE International Solid–State Circuits Conference, Feb. 1980, pp. 230–231.

Kiyoo Itoh et al., "Limitations and Challenges of Multigigabit DRAM Chip Design", IEEE Journal of Solid–State Circuits, vol. 32, No. 5, May 1997, pp. 624–634.

Yasuhiro Takai et al., "250 Mbyte/s Synchronous DRAM Using a 3–Stage–Pipelined Architecture", IEEE Journal of Solid–State Circuits, vol. 29, No. 4, Apr. 1994, pp. 426–430.

NEC Preliminary Data Sheet, MOS Integrated Circuit, 64M–bit Synchronous DRAM 4–bank, LVTTL for Rev.E, Document No. M12621EJ1V0DS00 (1st edition), pp. 1–82.

R. T. Tets Maniwa, "Focus Report: CMOS ASICs", Integrated System Design, Jul. 1997, 13 pp.

John H. Mayer, "Gearing up for Systems–On–Silicon Market", Electronics Buyers' News, Aug. 4, 1997, 1069, pp. 52, 54.

John L. Hennessy et al., "Computer Architecture A Quantitative Approach", Chapter 2, Second edition, pp. 67–82.

B. El–Kareh et al., "The Evolution of DRAM Cell Technology", Solid–State Technology, May 1997, pp. 89–101.

*Primary Examiner*—David Nelms
*Assistant Examiner*—David Lam
*Attorney, Agent, or Firm*—James J. Murphy, Esq.; Winstead Sechrest & Minick

[57] ABSTRACT

A memory cell and structure are implemented to provide a memory system having the advantages of both static and dynamic memories. A dynamic memory cell is implemented using a capacitor to store charge associated with a data value stored in the cell. The storage capacitor is accessible through multiple switches, and each of the switches is coupled to an independent bitline. Because independent bitlines are implemented, one bitline may sense the data value stored within the memory cell, while a second bitline is precharged, or refreshed, for a next memory operation to be performed. Thus, as soon as data is provided to the first bitline, any memory cells sharing the second bitline are ready to be sensed and restored even though they are all in the same data memory array. Such sequential operation is not possible with prior art DRAM memory cells because they require a refresh period in which to pre-charge bitlines accessing the same memory location. By providing the ability to access the same memory cell during a next subsequent timing cycle, a DRAM cell having a very low latency is implemented.

15 Claims, 5 Drawing Sheets

FIG. 10

LOW LATENCY DRAM CELL AND METHOD THEREFOR

TECHNICAL FIELD

The present invention relates in general to electronic memories, and in particular, to a dynamic random access memory (DRAM) having low latency, and systems and methods using the same.

BACKGROUND INFORMATION

As semiconductor technology has advanced, data processing applications, such as personal computers, workstations, communication systems, and the like have evolved rapidly to require faster and larger memory storage spaces. Specifically, semiconductor data processing systems typically implement RAM memories that allow any part of a memory to be read or written as fast as any part. Semiconductor RAMs are generally classified as non-volatile, static, and dynamic. Non-volatile RAMs are typically used for information that should be permanently stored, such as system information that is accessed during system start-up. A static RAM stores data in latches and is able to retain information while power is supplied to the memory. When the power is removed from the memory, the static memory loses all data stored therein. A dynamic random access memory (DRAM) is implemented through the use of a substantially smaller memory cell that must be refreshed periodically. Without such refresh operations, the DRAM cell would lose its information due to cell leakage through a capacitor implemented therein.

While DRAMs provide compact memory cells, the refresh requirements of DRAMs, in combination with other circuit requirements for proper operation, result in slower memory access times. Over the last two decades, the internal speed of data processors including microcontrollers and microprocessors has improved by a factor of approximately forty, while DRAM speed has improved by a factor of less than two. Furthermore, microprocessor clock frequencies are anticipated to quickly reach the 1 GHz range, while the fastest DRAM is only expected to reach 200 MHz in the same time period.

The speed of DRAMs is limited by several factors. For example, DRAMs tend to have longer cycle times because they are optimized for low power and not for speed, compared to static RAMs and some random logic circuits. Specifically, the speed with which a DRAM cell operates is limited by the requirement that the cell be periodically refreshed to compensate for the leakage of a capacitor used to implement each cell. In addition to the refreshing requirement, cycle times may also be adversely affected by contention from the refreshing requirement. Contention occurs when a DRAM memory cell that is being refreshed is concurrently required for access. In addition, read and write operations require a "pre-charge" or set up time, prior to "data sense and amplification.". Such information is well-known in the industry and is explained in greater detail in "Session XVII: Random Access Memories," by L. White, et al., published in the proceedings of the 1980 IEEE International Solid State Circuit Conference. Typically, the refresh operation has priority over other operations in DRAMs. Therefore, the read or write operation is postponed at least until the refresh operation is performed. In an effort to relieve such contention, some memory systems include cache memories, wherein a central processing unit of a data processing system is able to access a limited amount of memory more quickly and without potential contention problems, as such cache memory is typically implemented as a static RAM. However, even with the implementation of cache memories, cache misses occur when the required data is not available in the static RAM. Therefore, the data must then be accessed from the DRAM in a more time consuming operation.

In addition to the limitations associated with refresh operations and potential contention, DRAMs also have latency problems. Latency is a parameter used to measure an amount of time required to access a number of DRAM cells, a byte, or word after the appropriate address is asserted. Thus, the latency associated with a typical 16 megabit bank of DRAM cells that has 4,096 rows and 4,096 columns will be measured as a time required to step through such row or column of the memory, defined by the above-mentioned asserted address.

In an effort to solve some of the issues associated with refreshing, contention, and latency, several DRAM configuration and operation techniques have been implemented. Most recently, the use of a synchronous DRAM has been implemented to improve the speed associated with the conventional DRAM cell and memory peripheral circuits. Such synchronous DRAMs implement a 3-stage pipelined architecture to access conventional DRAM cells in a more timely manner. For additional information on such synchronous DRAM architectures, refer to "250MByte/Synchronous DRAM Using a 3-Stage Pipelined Architecture," *IEEE Journal of Solid-State Circuits,* Volume 29, No. 4, April 1994, by Yasuhiro Takai, et al., pp. 426–430. However, while methodologies, including synchronous DRAMs, have been implemented to optimize the latency, contention, and refresh requirements of DRAM cells, a requirement that a DRAM cell be refreshed still remains. This requirement imposes timing constraints that cannot be overcome using traditional memory cell implementations. Therefore, a need exists for a new memory cell, system architecture, and method for using both to meet the ever increasing demands for faster processing and greater memory capacity. Such implementation should be comprehensive and cost effective, as well as reduce the latency typically associated with the refresh requirements and resulting contention in a DRAM memory system.

SUMMARY OF THE INVENTION

The previously mentioned needs are fulfilled with the present invention. Accordingly, there is provided, in a first form, a dynamic random access memory cell. The dynamic random access memory cell includes a capacitor for storing a charge. A first transfer device is connected to the capacitor for selectively transferring a first portion of the charge to a first output during a first time period. A second transfer device is connected to the capacitor for selectively transferring a second portion of the charge to a second output during a second time period. The first time period and the second time period are consecutive.

Additionally, there is provided, in a second form, a memory cell. The memory cell includes a first transistor having a first electrode connected to a first bitline, a second electrode connected to a first wordline, and a third electrode. The memory cell also includes a second transistor having a first electrode connected to a second bitline, a second electrode connected to a second wordline, and a third electrode connected to the third electrode of the first transistor. A capacitor has a first electrode connected to the third electrode of the first transistor and a second electrode.

Furthermore, there is provided, in a third form, a method for operating a dynamic random access memory cell. The method includes the steps of storing a charge in a capacitor and selectively transferring a first portion of the charge to a first output during a first time period using a first transfer device. The method also includes the step of selectively transferring a second portion of the charge to a second output during a second time period using a second transfer device. The first time period and the second time period are consecutive.

As well, there is provided, in a fourth form, a memory in a data processing system. The memory includes an array of memory cells. A first bank of sense amplifiers is connected to a first portion of the array of memory cells. The first bank of sense amplifiers selectively accesses the first portion of the array of memory cells during a first time period. A second bank of sense amplifiers is connected to a second portion of the array of memory cells. The second bank of sense amplifiers selectively accesses the second portion of the array of memory cells during a second time period. The first time period and the second time period are consecutive.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth such as specific word, byte, or bit lengths and the like to provide a thorough understanding of the present invention. However, it will be obvious to those skilled in the art that the present invention may be practiced without such specific details. In other instances, well-known circuits have been shown in block diagram form in order not to obscure the present invention in unnecessary detail. Additionally, for the most part, details concerning timing considerations and the like have been omitted inasmuch as such details are not necessary to obtain a complete understanding of the present invention and are within the skills of persons of ordinary skill in the relevant art. Furthermore, during a description of the implementation of the invention, the terms "assert" and "negate" and various grammatical forms thereof, are used to avoid confusion when dealing with the mixture of "active high" and "active low" logic signals. "Assert" is used to refer to the rendering of a logic signal or register bit into its active, or logically true, state. "Negate" is used to refer to the rendering of a logic signal or register bit into its inactive, or logically false, state.

Refer now to the drawings wherein depicted elements are not necessarily shown to scale and wherein like or similar elements are designated by the same reference numeral through the several views.

Figure 1A:
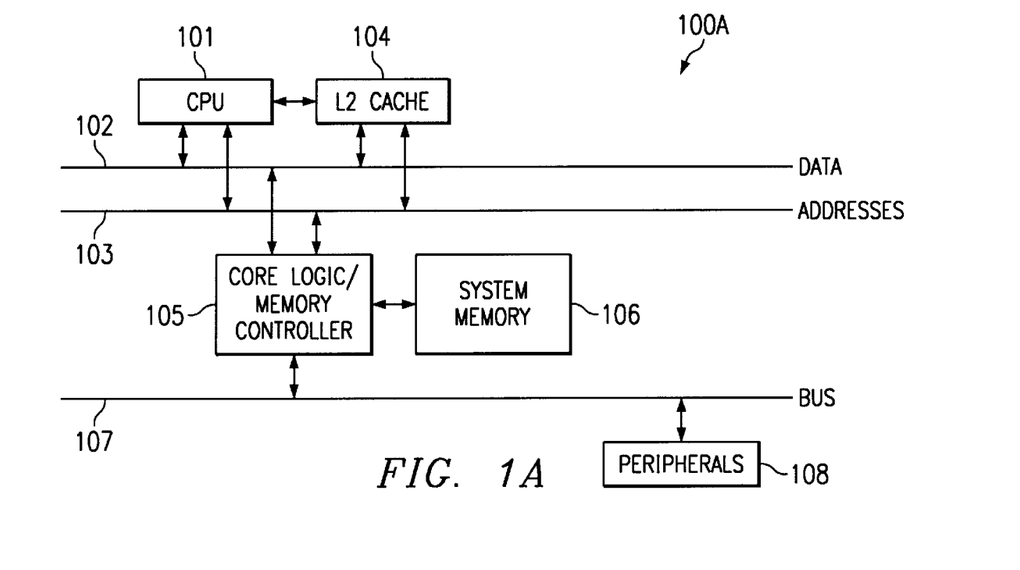
FIGS. 1A and 1B are block diagrams respectively depicting two basic system architectures 100A and 100B, typical of those found in personal computers.
Figure 1B:
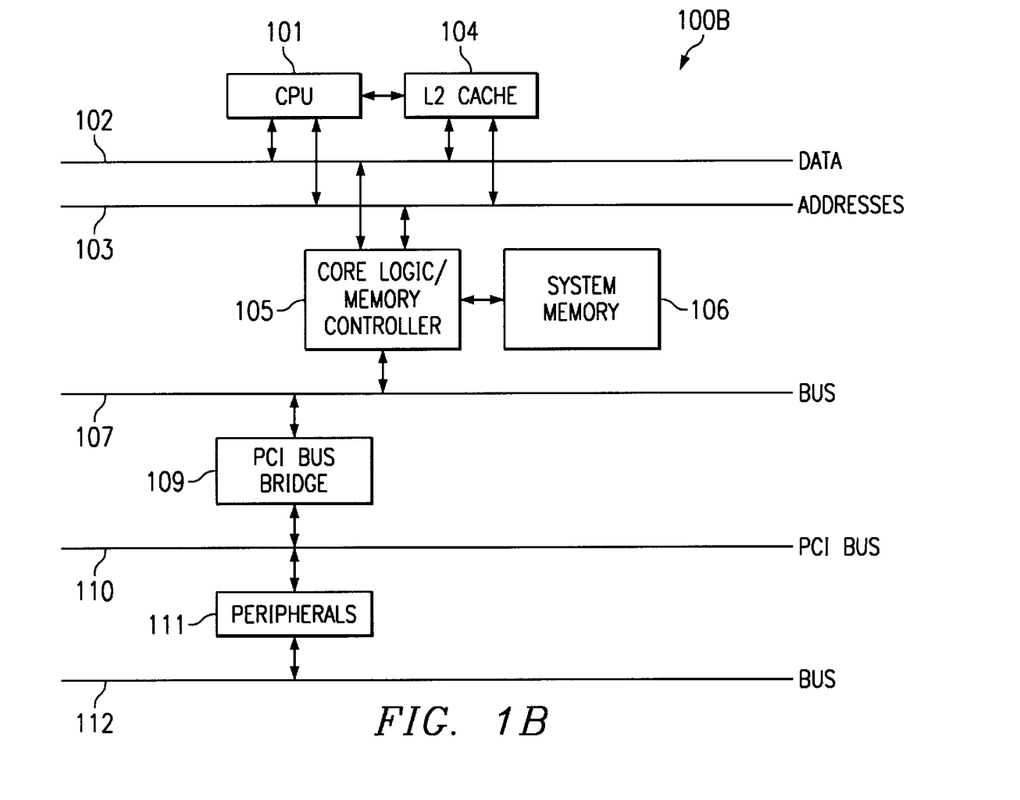

FIGS. 1A and 1B are block diagrams respectively depicting two basic system architectures 100A and 100B typical of those found in most data processing systems, including personal computers. While numerous variations of these basic architectures exist, FIGS. 1A and 1B are suitable for describing the basic structure and operation of most data processing systems.

Both systems 100A and 100B include a single central processing unit (CPU) 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107, in this case, is preferably a peripheral controller interface (PCI) bus. Alternatively, bus 107 could be an ISA, general, or specific purpose bus, as known in the art. In system 100B, core logic/memory controller 105 is again coupled to bus 107. A PCI bus bridge 109 then interfaces bus 107 with PCI bus 110, to which the peripherals 111 couple. An additional bus 112, which may be an ISA, PCI, VESA, IDE, general, or special purpose bus is provided for access to peripherals 111 from an external device or system (not illustrated herein).

In single CPU systems 100A and 100B, CPU 101 is the "master" which, in combination with the operating system and application software, controls the overall operation of system 100. Among other things, CPU 101 performs various data processing functions including numerical and word processing, generates graphics data, and performs overall system management. CPU 101 may be, for example, a complex instruction set computer (CISC), such as an Intel Pentium class microprocessor, a reduced instruction set computer (RISC), such as a PowerPC microprocessor available from IBM, Inc. or Motorola, Inc., or a very long instruction word (VLIW) machine.

CPU 101 communicates with the remainder of system 100 via CPU local address and data buses 102 and 103, each of which may be a special bus or a general bus, as is known in the art.

Core logic/memory controller 105, under the direction of CPU 101, controls the exchange of data, addresses, control signals and instructions between CPU 101, system memory 105, and peripherals 108/111 via bus 107 and/or bus bridge 109. Although the core logic/memory controller 105 allows tasks to be shifted from CPU 101 to allow CPU 101 to attend to other CPU-intensive tasks, CPU 101 can always override core logic/memory controller 105 to initiate execution of a higher priority task.

Core logic and memory controllers are widely available in the data processing industry, including the personal computer (PC) industry, and their selection and application are well-known by those skilled in the relevant art. The memory controller can be either a separate device or incorporated into the same chip set as the core logic. The memory controller is generally responsible for generating the memory clocks and control signals, such as system clock (SCLK), row address strobe (/RAS), column address strobe (/CAS), Read/$\overline{\text{Write}}$ (R/$\overline{\text{W}}$), and Bank Select. The memory controller also monitors and controls a cell refresh operation. Furthermore, the memory controller may also have some address generation capability for accessing sequences of pages within the memory.

The core logic is typically comprised of a chip-set, with one or more chips typically being "address and system controller intensive" and one or more of the chips typically being "data intensive." Among other things, the address intensive chip interface CPU 101 with address bus 103 and maintain the cache memory, including the cache tags, set associative of cache tags and other data necessary to ensure cache coherency. Additionally, the address intensive chips perform cache "bus snooping" and generate the control signals required for DRAMs in the system memory or cache. Furthermore, the address intensive chips control general management transactions within the system. The data intensive chips generally interface CPU 101 with data bus 102, issue cycle completion responses, and selectively abort operations if their cycles are incomplete. The data intensive chips also arbitrate for the data path of bus 102.

CPU 101 may directly communicate with core logic/memory controller 103 or may communicate thereto through an external (L2) cache 104. L2 cache 104 may be implemented as a 256 Kbyte fast SRAM device, in one example. Typically, CPU 101 also maintains up to 16 Kbytes of on-chip (L1) cache memory (not illustrated in detail herein).

PCI bus bridges, such as PCI bus bridge 109, are also well-known to those skilled in the art. In the typical PC, the CPU is the bus master for the entire bus system and, hence, devices such as PCI bus bridge 109 are slave devices that operate under command of the CPU.

Peripherals 108/111 may include a display controller and associated frame buffer, floppy drive controller, disk drive controller, and/or modem, and the like.

It should be noted that, although not illustrated herein, the principles of the present invention may also be embodied in multiprocessing devices and systems which are known to those with skill in the art.

Figure 2:
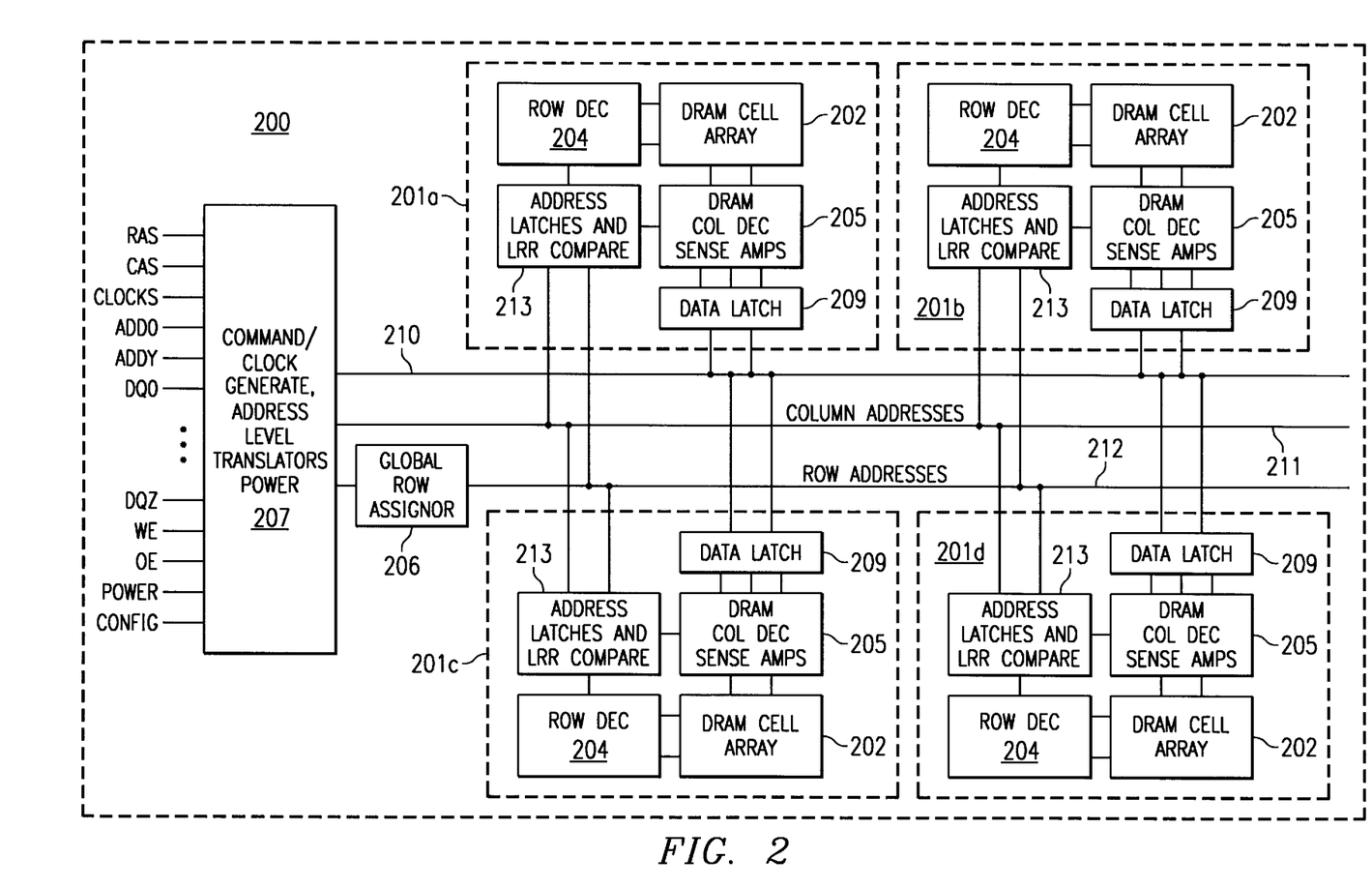
FIG. 2 illustrates, in block diagram form, a dynamic random access memory device in accordance with one embodiment of the present invention.

FIG. 2 illustrates one embodiment of a dynamic random access memory (DRAM) device 200 implemented in accordance with one embodiment of the present invention. It should be noted that DRAM 200 may be implemented within system 100A or 100B as L2 cache 104, or system memory 106. Furthermore, DRAM device 200 may also be implemented as another memory not illustrated within FIGS. 1A and 1B.

Memory 200 includes "n" memory banks or units 201, where "n" is an integer number. In FIG. 2, four banks 201A, 201B, 201C, and 201D are illustrated for discussion purposes. An actual number of banks may vary from application to application. Specifically, all banks 201 are active during each row access or /RAS cycle. Global row assigner 206 uses a preselected number of row address bits to select a bank to be accessed. Row decoders 204 consequently decode the remaining row address bits to simultaneously select one row per /RAS cycle in each DRAM array during a DRAM access.

Control circuitry 207 receives conventional DRAM control signals and clocks from an external source, such as CPU 101 or core logic 105 in systems 100A or 100B. These signals include a synchronous clock (SCLK), a row address strobe (/RAS), a column address strobe (/CAS), Read/$\overline{\text{Write}}$ select (R/$\overline{\text{W}}$), and an output enable (/OE), along with data (DQ) and addresses ($A_{dd}$). In one embodiment of the present invention, an address input port is multiplexed in the time domain in accordance with a conventional manner, wherein row addresses and column addresses are received sequentially at the same integrated circuit pins and latched to DRAM 200 using the /RAS and /CAS signals, respectively.

DRAM system 200 comprises data latches 209, DRAM sense amplifiers for sensing and amplification and column decoders 205, data bus 210 and appropriate peripheral circuitry. Column addresses are transferred via column address bus 211 and row addresses are transferred via row address bus 212.

Address latches and a last row read (LRR) compare circuit 213 comprise latching for storing a current row and column address received at an address port and referenced by $A_{dd}0$ through $A_{dd}Y$. Also, included as part of circuit 213 are latches for storing the high order row address bits (MSB) of the last row read (LRR) and a comparison circuit for comparing the stored LRR bits to the high order bits (MSB) of the current row address.

It should be noted that while in the illustrated embodiment the least significant row address bits are processed by global row assigner 206 and the most significant row address bits are used internal to the plurality of banks 201 to select individual rows of memory cells, other arrangements will just as easily apply. For example, a given number of most significant row address bits could be used by global row assigner 206 and the remaining least significant bits could be used for individual row select operations. Further, either big- or little-endian data structures may be utilized.

Figure 3:
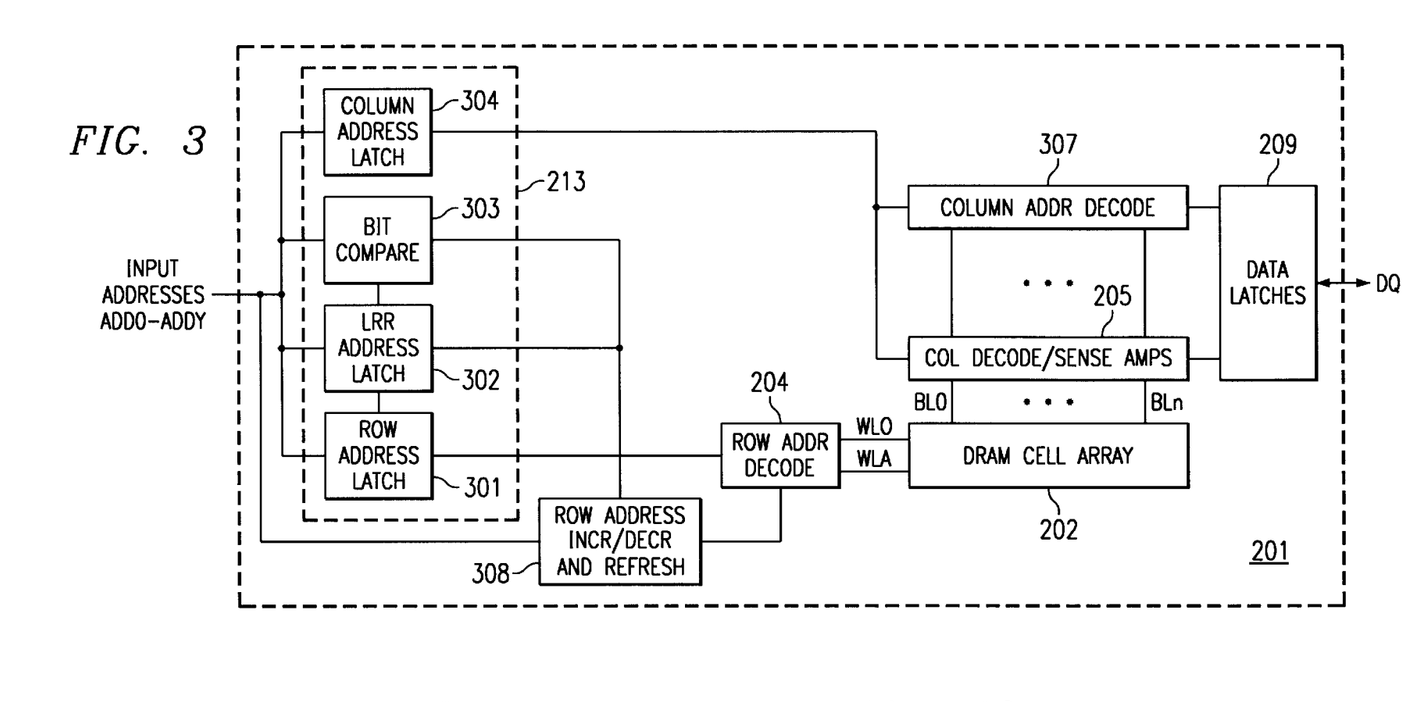
FIG. 3 illustrates, in block diagram form, a more detailed diagram of a DRAM memory bank in accordance with one embodiment of the present invention.

FIG. 3 is a more detailed diagram emphasizing the data and address routing circuitry of a selected bank 201. In bank 201, addresses are received in a multiplexed fashion at the address port referred to as $A_{dd}0$ through $A_{dd}Y$. The row address bits are latched on the following edge of a /RAS signal that follows the SCLK signal (not illustrated in detail in FIG. 3) into row address latch 301. The most significant bits are provided to the fine granularity row decoders 204 and the least significant bits are provided to the global row assigner 206 (not illustrated in FIG. 3). The most significant row address bits from the previous (last) /RAS cycle are transferred to last row read address latch 302. Comparison circuitry 303 compares the most significant row address bits latched into row address latch 301 and the last read row address held in latch 302. During each /CAS cycle, one or more column addresses are received at address port $A_{dd}0$ through $A_{dd}Y$, and latched into column address latch 304 with each falling edge of the /CAS signal.

Row address increment/decrement refresh control circuit 308, when enabled, steps through the rows of DRAM cell array 202 to perform cell refresh operations through the DRAM sense amps and implements the address transformations detailed below.

In one method for operating DRAM system 200, a row address is first received at address pins $A_{dd}0$ through $A_{dd}Y$ during an access operation. On the falling edge of /RAS, the least significant row address bits (in the four bank embodiment, two least significant bits) are passed to global row assigner 206. The remaining most significant bits are latched into each row address latch 301 of each bank 201. The most significant bits stored in each row address latch 301 from the previous /RAS cycle are transferred into the corresponding LRR address latch 302. Subsequently, the contents of DRAM cell array 202 may be read or written in accordance with well-known principles. Additionally, the memory cells within DRAM cell array 202 may also be periodically refreshed using well-known refresh techniques.

It should be noted that alternate memory systems may be implemented in accordance with the present invention.

Figure 4:
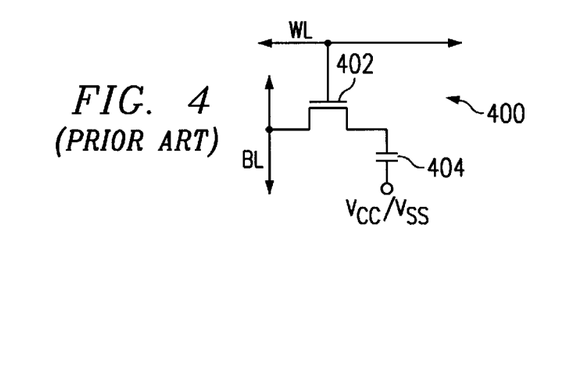
FIG. 4 illustrates, in circuit diagram form, a prior art DRAM cell.

In prior art embodiments of the present invention, DRAM cell array 202 is implemented using a plurality of memory cells 400 such as those illustrated in FIG. 4. Memory cell 400 comprises a transistor 402 and a capacitor 404. During operation of DRAM cell 400, the presence of charge (electrons) in capacitor 404 indicates a logical 0 value and the absence of charge in capacitor 404 indicates a logical 1 value is stored in memory cell 400. Alternate methods for determining a logic value to be associated with energy stored in a capacitor are also available, as is well-known to those with skill in the art.

Typically, DRAM memory cells are arranged in arrays of rows (wordlines or WL) and columns (bitlines or BL) that are orthogonal to each other. Multiple sub-arrays sometimes replace a single large array to shorten the word and bitlines and, thereby, reduce the time required to access the memory cells. During operation of this DRAM cell, when a wordline is selected, all transfer devices, such as transistor 402, connected to the wordline are enabled and charge transfer occurs between capacitor 404 and the bitline.

Furthermore, before a read or write operation, the bitline, BL, is pre-charged to a predetermined voltage, $V_B$, halfway between the internal power supply $V_{dd}$ and a ground voltage. It should also be noted that other pre-charge schemes well-known in the data processing art will also function equally as well. Then, to read cell 400, the selected wordline (WL, in this example) is raised to a $V_{dd}$ voltage level, thereby turning on transistor 402 and all other transfer devices (not illustrated herein) connected to the wordline. Sensing of data and amplification are then performed to determine a logic value to be associated with the memory cell.

Because charge reflecting a value of the memory cell is stored within capacitor 404, it should be well-known to those with skill in the art that the stored charge decays away with time because of inherent leakage within capacitor 404, and the cell retention time of a typical DRAM device ranges from milliseconds to hundreds of milliseconds. Therefore, a periodic refresh operation is necessary to restore charge stored in capacitor 404 before its level drops below a critical value, where a logic 1 value is indistinguishable from a logic 0 value. For a more detailed discussion of operation of a typical DRAM cell, refer to "The Evolution of DRAM Cell Technology," by B. El-Kareh, et al., published in *Solid State Technology*, May 1997, pp. 89–101, which is hereby incorporated by reference herein.

As previously mentioned, the DRAM cell disclosed in FIG. 4 may not be successively accessed because the bitline (BL) must be pre-charged before the data within capacitor 404 may again be read. This pre-charge operation requires at least one clock cycle and usually more. Furthermore, when the bitline is being pre-charged, data stored within the DRAM memory cell may not be sensed or restored. Therefore, should the same cell be accessed in subsequent, successive operations, memory cell 400 would not be able to provide the required data in a timely manner. Rather, a device accessing cell 400 would be forced to wait for the time required to pre-charge the bitline before the cell could again be accessed. Additionally, when the bitline is sensing the data stored within capacitor 404, all other rows are inaccessible within a same memory bank. Because of the limitations associated with pre-charging and refreshing prior art DRAM cells, the time required to access data from a DRAM cell is substantially longer than that required to access data from a static memory cell.

In order to solve the latency issues associated with prior art DRAM cells, such as that illustrated in FIG. 4, the present invention implements a low latency DRAM cell that allows a same dynamic memory cell to be accessed during successive timing cycles within very low latency. Thus, the low latency DRAM cell of the present invention emulates a static memory cell, without requiring the power consumption or the numerous active elements typically associated with such static cells. The present invention implements the low latency DRAM cell by providing two independent ports to the same storage capacitor. Because the ports are independent, one port, or bitline, may be pre-charged, while the other port, or bitline, is performing a sensing operation. A description of the low latency DRAM cell of the present invention and operation thereof will subsequently be provided in greater detail.

Figure 5:
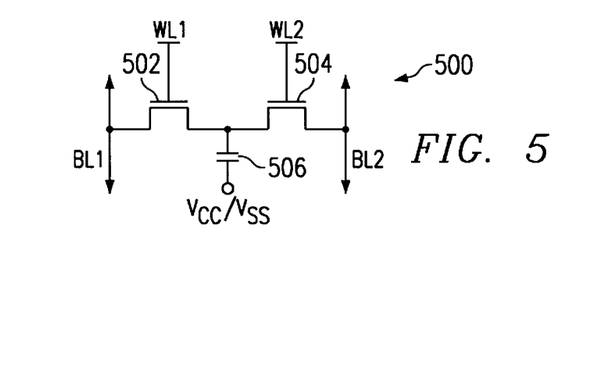
FIG. 5 illustrates, in circuit diagram form, a DRAM cell in accordance with one embodiment of the present invention.

Refer now to FIG. 5. FIG. 5 illustrates a low latency DRAM cell 500. Low latency DRAM cell 500 comprises an access transistor (switch) 502, an access transistor (switch) 504, and a capacitor 506. A first bitline, BL1, is coupled to a first terminal of transistor 502. A first wordline, WL1, is coupled to a second electrode of transistor 502. A third electrode of transistor 502 is coupled to a first electrode of capacitor 506 and a first electrode of transistor 504. A second electrode of capacitor 506 is coupled to a reference voltage. The reference voltage may be $V_{cc}$ (a most positive voltage), $V_{ss}$ (a ground voltage), or an intermediate value therebetween. A second electrode of transistor 504 is coupled to a second wordline, WL2. A third electrode of transistor 504 is coupled to a second bitline, BL2.

During operation of low latency DRAM cell 500, WL1 may be enabled to read or write data to memory cell 500 by charge sharing between BL1 and storage capacitor 506. When BL1 is sensing the data stored within memory cell 500, BL2 may be pre-charged for subsequent operations. Subsequently, after data stored within memory cell 500 is restored in capacitor 506, any cells sharing BL2 are then ready to be sensed and restored, even though they are in the same storage array. For additional information regarding pre-charging, sensing, restore, and amplification operations, refer to "Session XVII: Random Access Memories," by L. White, et al., published in the proceedings of the 1980 IEEE International Solid State Circuit Conference, which is hereby incorporated by reference herein. Such successive accesses to the same memory cell are not available in prior art techniques as only one bitline is typically provided in prior art cells to perform a sensing operation, and that bitline must be pre-charged before the memory cell could be correctly read.

Because a device accessing memory cell 500 of the present invention is not required to wait while the bitline is pre-charging before performing a successive sensing function on the same memory cell, the latency associated with accessing the cell is substantially decreased. A resulting effect is that the low latency memory cell 500 of the present invention may be accessed in successive timing cycles, much the same way that a static memory cell is accessible. However, because bitlines associated with the memory cell of the present invention are being pre-charged while another operation is being performed on the memory cell, a circuit structure typically required for performing static memory operations is not required. Therefore, the low latency DRAM cell 500 of the present invention effectively performs a static memory storage function while requiring significantly less power than is required for typical static memory cells.

Figure 6:
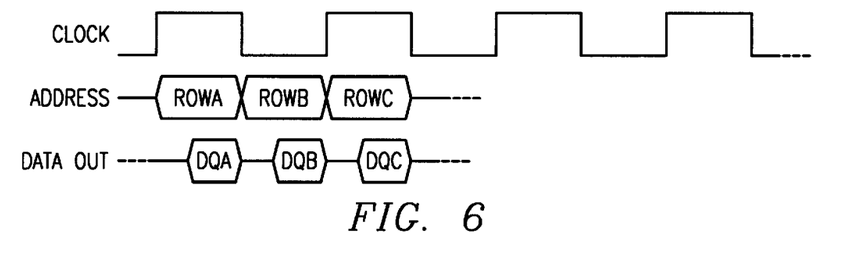
FIG. 6 illustrates, in timing diagram form, a timing associated with a DRAM array access operation in accordance with one embodiment of the present invention.

FIG. 6 provides a timing diagram that illustrates operation of the present invention. A Clock signal represents a system clock signal provided to a DRAM system, such as that illustrated in FIGS. 2 and 3. During operation, assume that a plurality of addresses may be accessed using a same bitline in the DRAM cell array. Thus, only row addresses are provided to access each successive value stored within the DRAM cell array. By accessing a row address A, a row address B, and then a row address C, a plurality of data values may be accessed from the DRAM cell array.

In one embodiment of the present invention, a first address, referred to as row A, may be accessed by the assertion of WL1, such that the data stored within capacitor 506 is transferred to first bitline, BL1. While the data stored within memory cell 500 is being transferred to BL1, a second bitline, BL2, may be pre-charged to be available for a next timing cycle. Therefore, when the WL2 signal is asserted in response to the "row B" address, data may be transferred from capacitor 506 to BL2. While data is being transferred to BL2, BL1 is pre-charged such that the data stored within capacitor 506 may again be retrieved during a next address is provided. Thus, several bits, bytes, or words sharing a common wordline (WL1 or WL2) can be accessed successively with low latency in a manner not available with prior art devices.

In the present invention, the pre-charging operations required by all DRAM cells are performed, but an external device accessing the memory observes very low latency between a data request and a data access, as the user is not required to wait for the pre-charging step to be performed as was generally done in prior art systems. This external "pre-charge time limitation" is referred to as "TRP."

It should be noted that the timing diagram of FIG. 6 illustrates one embodiment of the present invention in which the memory cell is controlled according to the following rules. In accordance with these rules, when the Clock signal is a logic high value, WL1 may be asserted to access data stored within the memory cell. Additionally, WL2 is negated to allow BL2 to pre-charge. Conversely, when the clock signal is negated, the WL1 signal is negated to allow BL1 to be pre-charged. Additionally, the WL2 value may be asserted to access data stored within capacitor 506 of memory cell 500. These rules may be implemented through logic circuitry and state machines.

By providing appropriate control such as that described above, the low latency memory cell of the present invention may be implemented in DRAM system configurations, including synchronous DRAM system configurations, with no significant modifications. Indeed, only a modification of the memory cell structure in accordance with an embodiment of the present invention and the control required to access that memory cell structure would be required to implement the concepts of the present invention in currently available memory system architectures. The control required to access such memory cell structure is well-known to those with skill in the relevant art and, therefore, will not be described in great detail herein.

Figure 7:
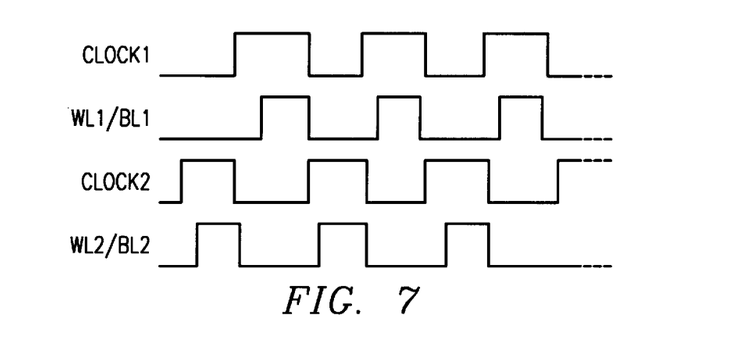
FIG. 7 illustrates, in timing diagram form, a timing associated with a DRAM array access operation in accordance with an alternate embodiment of the present invention.

FIG. 7 illustrates a timing diagram of an alternate method for controlling operation of the low latency DRAM cell of the present invention. As illustrated in FIG. 7, assume that DRAM system 200 is a two-clock system, wherein WL1 and BL1 are appropriately activated to access a data value stored in a memory cell upon an active state of a first clock. Furthermore, WL2 and BL2 are appropriately activated to access a data value stored in a memory cell upon an active state of a second clock. The first and second clocks may be out-of-phase, but are not required to be so. In either case, the data stored within the same memory cell or cells accessing the same wordline may be accessed on successive clock cycles, as was discussed with respect to FIG. 6.

It should be noted that the clocks, Clock 1 and Clock 2, could be provided externally, internally, or a combination of the two using well-known phase lock loop techniques. Such clock generation techniques are well-known to those with skill in the art and, therefore, will not be described in greater detail herein.

Given the ability of the present invention to be implemented within DRAM systems in a manner that allows for the successive access of data from the same memory cell or cells sharing specific wordlines, the present invention may also be used in an intermingling refresh operation. Such intermingling refresh operations allow a refresh operation to be performed concurrently with a read or write operation and are not possible in the prior art DRAM cells described above.

Figure 8:
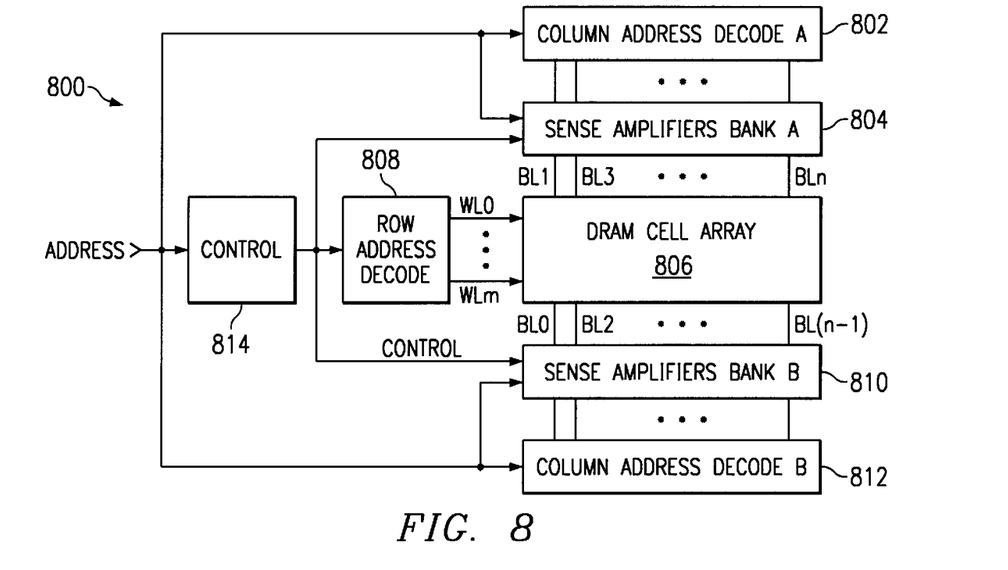
FIG. 8 illustrates, in block diagram form, a DRAM system in accordance with one embodiment of the present invention.

Additionally, a system in which the low latency DRAM cell is implemented may be optimized to take advantage of the unique configuration of the DRAM cell of the present invention. Refer now to FIG. 8 for an illustration of an optimized memory system. Memory system 800 of FIG. 8 comprises a column address decode A circuit 802, a plurality of sense amplifiers bank A 804, a DRAM cell array 806, a row address decode circuit 808, a plurality of sense amplifiers bank B 810, column address decode B circuit 812, and control circuit 814. A plurality of address signals are provided to each of column address decode A circuit 802, the plurality of sense amplifiers bank A 804, control circuit 814, column address decode B circuit 812, and the plurality of sense amplifiers bank B 810.

During operation, control circuit 814 decodes the address signals to provide row address increment, decrement and refresh control signals to row address decode circuit 808. Additionally, control circuit 814 provides control signals to sense amplifiers 804 and 810 to selectively control their sensing operations. Column address decode A circuit 802 is coupled to the plurality of sense amplifiers bank A 804. The plurality of sense amplifiers 804 are coupled to DRAM cell array 806 to sense data provided on a portion of the bitlines coupled to DRAM cell array 806. For example, the plurality of sense amplifiers bank A 804 may be coupled to DRAM cell array 806 to sense data provided by odd bitlines, BL1, BL3 . . . BLn. Similarly, the plurality of sense amplifiers bank B 810 are coupled to DRAM cell array 806 to communicate via the even bitlines, BL0, BL2 . . . BL(n−1). Column address decode B circuit 812 is coupled to the plurality of sense amplifiers bank B 810. Row address decode circuit 808 is coupled to DRAM cell 806 to provide the plurality of wordlines WL0 through WLm.

During operation of memory system 800 of FIG. 8, a same row decode circuit 808 asserts a wordline to access a first data value stored within DRAM cell array 806. It should be noted that the cells within DRAM cell array 806 are implemented as the low latency DRAM circuit of the present invention in one embodiment of the present invention. By segregating sense amplifiers into two or more sections, memory system 800 optimizes the circuit design of the present invention by implementing a device in which a first bank of sense amplifiers is pre-charging, while the second bank of sense amplifiers is selectively sensing. Thus, power may be saved as an entire bank of sense amplifiers is not performing either the pre-charging or the sensing operation at the same time. Furthermore, the banks of sense amplifiers may reverse their roles in time using either the one clock timing scheme or the two clock timing scheme previously described.

It should be noted that an architecture for a sense amplifier utilized to form the plurality of sense amplifiers 804 and 810 is well-known to those with skill in the art and, therefore, will not be described in greater detail herein.

Figure 9:
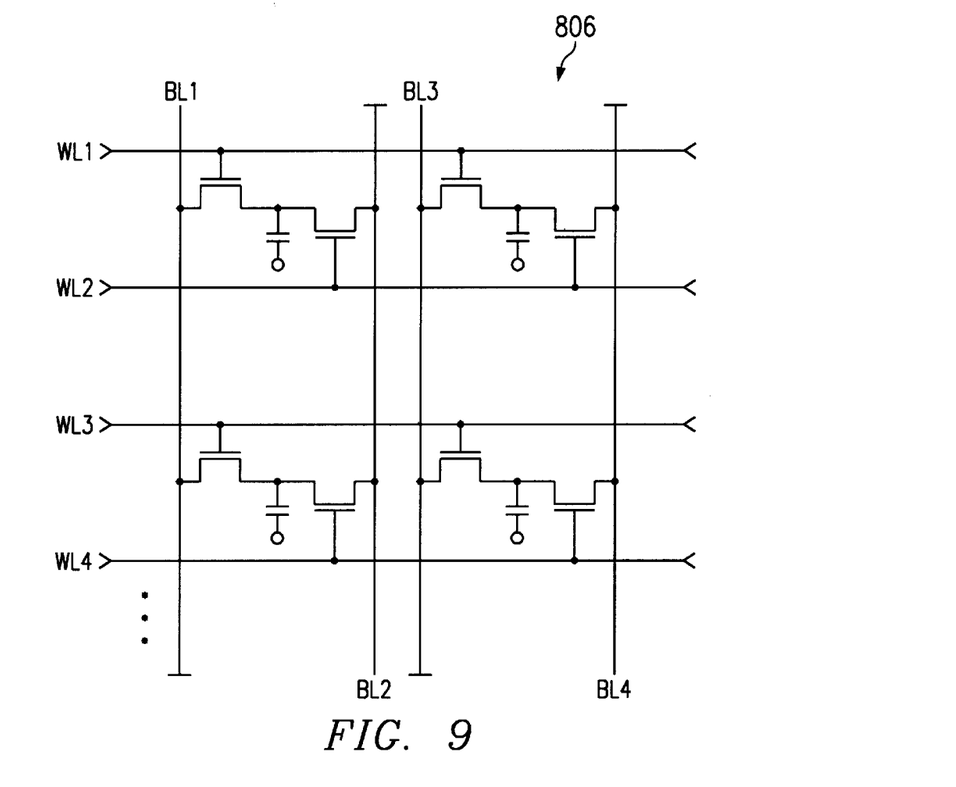
FIG. 9 illustrates, in circuit diagram form, a portion of a DRAM cell array of FIG. 8.

FIG. 9 illustrates an array 900 of low latency DRAM cells, that may be implemented in accordance with the memory system of FIG. 8. Again, note that the odd bitlines are provided to a first bank of sense amplifiers, while the even bitlines are provided to the second bank of sense amplifiers. It should be noted that such a division among bitlines is not required, but is illustrated to implement one embodiment of the present invention.

Figure 10:
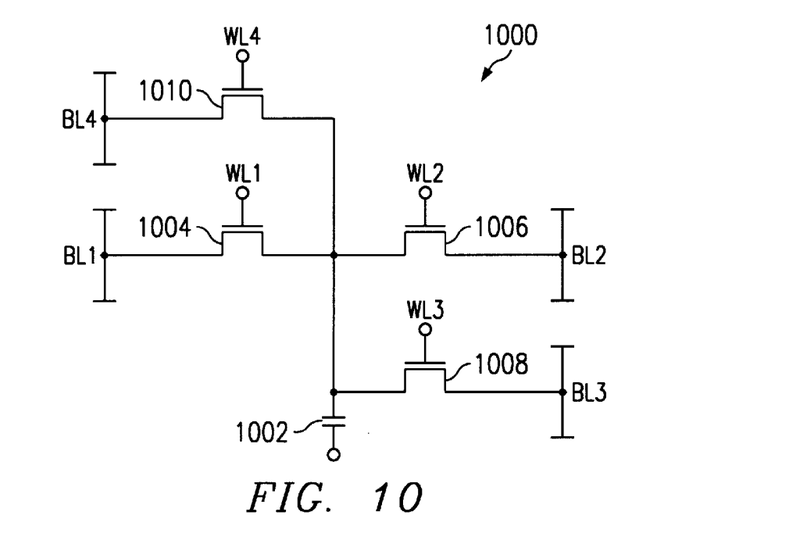
FIG. 10 illustrates, in circuit diagram form, an embodiment of a DRAM cell in accordance with an alternate embodiment of the present invention.

FIG. 10 illustrates an alternate embodiment of a memory cell of the present invention. FIG. 10 illustrates a multi-port memory cell 1000. Memory cell 1000 comprises a capacitor 1002, a transistor 1004, a transistor 1006, a transistor 1008, and a transistor 1010. A first bitline, BL1, is coupled to a first electrode of transistor 1004. A first wordline, WL1, is coupled to a second electrode of transistor 1004. A third of electrode of transistor 1004 is coupled to a first electrode of capacitor 1002, transistor 1006, transistor 1008, and transistor 1010. A second electrode of capacitor 1002 is coupled to a reference voltage, such as a reference ground voltage. A second electrode of transistor 1006 is coupled to a second wordline, WL2. A third electrode of transistor 1006 is coupled to a second bitline, BL2. A second electrode of transistor 1008 is coupled to a third wordline, WL3. A third electrode of transistor 1008 is coupled to a third bitline, BL3. A second electrode of transistor 1001 is coupled to a fourth wordline, WL4. A third electrode of transistor 1010 is coupled to a fourth bitline, BL4.

In multi-port memory cell 1000, the same memory cell may be accessed in succession using four different ports. Additionally, it should be noted that the multi-port memory cell illustrated in FIG. 10 may be modified to have additional or fewer accessing transistors, such as transistors 1004 through 1010. Such a group of "multi-port" cells in the same memory array can execute arithmetic and logic operations in less time than DRAM cells available in the prior art.

Although the low latency DRAM cell of the present invention is a dynamic circuit, the cell emulates the function of a static memory cell. By providing multiple ports, refresh operations may be "hidden" and do not result in added latency. Additionally, any address within a memory may be accessed in a clock cycle immediately following a previous access to the same cell, without a pre-charge time penalty. Given the fact that such low latency DRAM cells emulate static memory operation, the low latency DRAM cell of the present invention may be used to replace static memory driven register architecture in CPUs, microcontrollers, as well as content addressable memory cells. The low latency DRAM cell of the present invention provides a functionality associated with typical static RAM implementations, together with the power saving of dynamic memory cells. Furthermore, because the low latency DRAM cell of the present invention provides the ability to perform a read operation at one address, while concurrently writing into another address, the application is very powerful for updating visual data, such as graphics and video frame buffers.

The foregoing has provided a detailed description of the present invention. However, it will be well-known to those with skill in the art that additional implementations may also exist. For example, the DRAM cell of the present invention may be implemented in stand-alone DRAM systems, as well as single chip systems-on-silicon, with embedded memory logic. It should be noted that the low latency DRAM cell of the present invention is especially useful for single chip systems-on-silicon as the same processing steps may be utilized to manufacture an entire data processing system, including the memory structures. The low latency DRAM cell of the present invention provides improved performance by providing data at higher speeds and lower power. The low latency DRAM cell may be implemented in central processing units as register elements, or replace static RAMs in multi-level cache systems. Additionally, the low latency DRAM cell of the present invention may be utilized in integrated solutions such as enhanced DRAMs and single chip embedded memory and logic in a manner similar to that typically used for static memory cells.

Although the present invention and its advantages have been described in detail, it should be understood that various changes, substitutions and alterations can be made herein without departing from the spirit and scope of the invention as defined by the appended claims.

What is claimed is:

1. A dynamic random access memory cell, with hidden precharge comprising:
    a capacitor for storing charge;
    a first transfer device coupled to the capacitor for selectively exchanging charge with a first output via an independently precharged first read/write conductor during a first time period; and
    a second transfer device coupled to the capacitor for selectively exchanging charge with a second output via an independently precharged second read/write conductor during a second time period, wherein the first time period and the second then period are consecutive and the second read/write bitline is precharged during the first time period and the first read/write bitline is precharged during the second period.

2. The dynamic random access memory cell of claim 1, wherein the first transfer device is disabled when the second transfer device selectively transfers the second portion of the charge to the second output.

3. The dynamic random access memory cell of claim 1, wherein the second transfer device is disabled when the first transfer device selectively transfers the first portion of the charge to the first output.

4. The dynamic random access memory cell of claim 1, further comprising:
    a first conductor for communicating a first enable signal for selectively enabling the second transfer device to transfer the second portion of the charge to the second output; and
    a second conductor coupled to the second output for selectively transferring the second portion of the charge.

5. The dynamic random access memory cell of claim 4, wherein the second conductor is charged to a preselected logic level when the first transfer device selectively transfers the first portion of the charge to the first output.

6. The dynamic random access memory cell of claim 4, further comprising:

a third conductor for communicating a second enable signal for selectively enabling the first transfer device to transfer the first portion of the charge to the first output; and a fourth conductor coupled to the first output for selectively transferring the first portion of the charge.

7. The dynamic random access memory cell of claim 6, wherein the second conductor is charged to a preselected logic level when the second transfer device selectively transfers the second portion of the charge to the second output.

8. A memory cell, comprising:

a first transistor having a first electrode coupled to a first read/write bitline, a second electrode coupled to a first wordline, and a third electrode;

a second transistor having a first electrode coupled to second read/write bitline, a second electrode coupled to a second wordline, and a third electrode coupled to the third electrode of the first transistor;

a capacitor having a first electrode coupled to the third electrode of the first transistor and a second electrode; and wherein;

the first transistor selectively exchanges charge between the first bitline and the capacitor and the second bitline is substantially simultaneously precharged during a first time period, and said second transistor selectively exchanges charge between the second bitline and said first bitline is simultaneously charged during a second time period.

9. The memory cell of claim 8, wherein the second electrode of the capacitor is coupled to a reference voltage.

10. The memory cell of claim 8, wherein the capacitor stores a charge, the first transistor selectively transfers a first portion of the charge to the first bitline during a first time period, and the second transistor selectively transfers a second portion of the charge to the second bitline during a second time period, and wherein the first time period and the second time period are successive.

11. The memory cell of claim 10, wherein the second bitline is pre-charged to a first logic level during the first time period.

12. The memory cell of claim 11, wherein the first bitline is pre-charged to a second logic level during the second time period.

13. A method for hiding precharge a dynamic random access memory cell, comprising the steps of:

storing a charge in a capacitor;

selectively transferring a portion of the charge to a first output via a first previously precharged read/write conductor during a first time period using a first transfer device;

substantially simultaneously with said step of selectively transferring the portion of the charge, precharging a second read/write conductor during the first period; and selectively transferring a portion of the charge to a second output via the precharged second read/write conductor during a second time period using a second Transfer device, wherein the first time period and the second time period are consecutive.

14. The method of claim 13, further comprising the steps of:

enabling the first transfer device to transfer the first portion of the charge to the first output;

coupling the first output to a first conductor;

sensing the first portion of the charge transferred by the first conductor; and pre-charging a second conductor coupled to the second transfer device concurrently with sensing the first portion of the charge.

15. The method of claim 14, further comprising the steps of:

enabling the second transfer device to transfer the second portion of the charge to the second output;

coupling the second output to the second conductor;

sensing the second portion of the charge transferred by the second conductor; and pre-charging the first conductor concurrently with sensing the second portion of the charge.

* * * * *

UNITED STATES PATENT AND TRADEMARK OFFICE
CERTIFICATE OF CORRECTION

PATENT NO.         : 5,856,940
APPLICATION NO. : 08/911737
DATED                 : January 5, 1999
INVENTOR(S)        : G. R. Mohan Rao Page 1 of 1

It is certified that error appears in the above-identified patent and that said Letters Patent is hereby corrected as shown below:

On Title 1, column 1, under the heading "References Cited", add:

5,781,482        7/1998             Sakata..........................................................365/149

Signed and Sealed this

Eighth Day of May, 2007

JON W. DUDAS
*Director of the United States Patent and Trademark Office*